US009933464B2

(12) United States Patent
Popov

(10) Patent No.: US 9,933,464 B2
(45) Date of Patent: Apr. 3, 2018

(54) POWER DETECTOR

(71) Applicant: Qualcomm Technologies International, Ltd., Cambridge (GB)

(72) Inventor: Oleg Popov, Cambridge (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 232 days.

(21) Appl. No.: 14/995,976

(22) Filed: Jan. 14, 2016

(65) Prior Publication Data
US 2017/0205450 A1    Jul. 20, 2017

(51) Int. Cl.
G01R 5/14       (2006.01)
G01R 21/06      (2006.01)
G01R 17/02      (2006.01)
G01R 19/02      (2006.01)

(52) U.S. Cl.
CPC .............. *G01R 21/06* (2013.01); *G01R 17/02* (2013.01); *G01R 19/02* (2013.01)

(58) Field of Classification Search
CPC ......... G01R 21/06; G01R 19/02; G01R 17/02
See application file for complete search history.

(56) References Cited

U.S. PATENT DOCUMENTS

| 4,862,889 | A * | 9/1989 | Feucht .............. A61B 18/1206 128/908 |
| 7,433,658 | B1 * | 10/2008 | Shirvani-Mahdavi ............. H03G 3/3042 455/115.1 |
| 7,738,845 | B2 * | 6/2010 | Takahashi ............. H03G 3/3047 455/126 |
| 8,274,333 | B2 * | 9/2012 | Dupuis ..................... H03F 1/52 330/207 P |
| 8,471,550 | B2 * | 6/2013 | Dupuis ................ H03G 3/3042 324/142 |

(Continued)

FOREIGN PATENT DOCUMENTS

GB        2409049 A       6/2005

OTHER PUBLICATIONS

International Search Report and Written Opinion—PCT/EP2016/078358—ISA/EPO—Feb. 8, 2017. 12 Pages.

*Primary Examiner* — Tung X Nguyen
*Assistant Examiner* — Dominic Hawkins
(74) *Attorney, Agent, or Firm* — Procopio, Cory, Hargreaves & Savitch LLP

(57) ABSTRACT

A power detector measures RF power delivered into a first load of uncertain impedance. A reference power meter measures power of a reference signal to a second load of known impedance. The reference power meter measures voltage across the second load; measures a current through the second load; and multiplies the measured voltage by the measured current to generate a reference power signal proportional to power delivered to the second load. A measurement power meter measures power of a signal to the first load. The measurement power meter measures voltage across the first load; measures current through the first load; and multiplies the measured voltage by the measured current to generate a measured power signal proportional to power delivered to the first load. The power detector includes a processor to calculate power delivered to the second load, and to generate a power delivered to the first load.

14 Claims, 2 Drawing Sheets

(56) References Cited

U.S. PATENT DOCUMENTS

| | | | | |
|---|---|---|---|---|
| 2010/0301837 A1* | 12/2010 | Higuma | ............ | G01R 21/06 324/140 R |
| 2011/0102047 A1* | 5/2011 | Sun | ............ | G01R 21/01 327/306 |
| 2011/0273164 A1* | 11/2011 | Dupuis | ............ | G01R 21/07 324/142 |
| 2014/0152294 A1 | 6/2014 | Holt | | |
| 2016/0315719 A1* | 10/2016 | Jian | ............ | H04B 17/13 |

* cited by examiner

POWER DETECTOR

FIELD

The present application relates to a power detector for measuring RF power, and to a method for measuring RF power.

BACKGROUND

Measurement and control of output or transmit power in radio frequency (RF) wireless transmission systems has always been important, for example to ensure that the power of the transmitted signal meets regulatory requirements, to ensure that components such as a power amplifier in the transmit chain are operating within safe limits, and to minimise current consumption in the transmit chain, and therefore minimise power consumption.

One widely used method for measuring and tracking output or transmit power in wireless transmitters involves measuring a peak output voltage and using the measured peak output voltage to estimate the output or transmit power. However, this method is prone to significant error when the output impedance of the transmitter differs from a default value. As a result a power control system of the transmitter could be misled, and the performance, for example the linearity, current consumption or transmit power mask, of the transmitter could deteriorate significantly.

Accordingly, a more accurate and reliable method for measuring output transmit power is required.

SUMMARY

In one aspect, a power detector for measuring RF power delivered into a first load of uncertain impedance is provided. The power detector includes a reference power meter for measuring the power of a known reference signal, wherein the reference power meter has an input which receives the known reference signal and an output connected to a second load which is of known impedance, where the reference power meter includes a first voltage detector configured to measure a voltage across the second load; a first current detector configured to measure a current through the second load; and a first multiplier for multiplying the measured voltage across the second load by the measured current through the second load to generate a reference power signal that is proportional to the power delivered to the second load. The power detector further includes a measurement power meter for measuring the power of a signal to be measured, where the measurement power meter has an input which receives the signal to be measured and an output connected to the first load, where the measurement power meter includes a second voltage detector configured to measure a voltage across the first load; a second current detector configured to measure a current through the first load; and a second multiplier for multiplying the measured voltage across the first load by the measured current through the first load to generate a measured power signal that is proportional to the power delivered to the first load. The reference power meter and the measurement power meter are configured substantially identically, such that a constant of proportionality that links the reference power signal to the power delivered to the second load is equal to a constant of proportionality that links the measured power signal to the power delivered to the first load. The power detector further includes a processor configured to calculate, based on a voltage of the known reference signal and the impedance of the second load, a power value for power delivered to the second load, and to generate, based on the calculated power delivered to the second load, the measured power signal and the reference power signal, a power value for power delivered into the first load.

The power detector of the present disclosure permits rapid and accurate measurement or estimation of the real-time power being delivered into a load of uncertain impedance. The use of a reference power detector that measures the power of a known reference signal delivered into a known load permits accurate calibration and re-calibration of the power detector, to ensure accurate measurement or estimation of the power being delivered into the load of uncertain impedance.

The reference power meter may further include a first averaging unit configured to generate an average of the reference power signal over time, and the measurement power meter may further comprise a second averaging unit configured to generate an average of the measured power signal over time.

The first averaging unit may be configured to generate the average over at least one period of the reference power signal, and the second averaging unit may be configured to generate an average over at least one period of the measured power signal.

The first and second multipliers may be configured to perform a vector multiplication.

The reference power signal may be a DC signal.

Alternatively, the reference power signal may be an AC signal having a root mean square amplitude of known value.

The power detector may further include a multiplexer configured selectively to transmit a signal output by the first power meter or a signal output by the second power meter to the processor.

The processor may be configured to calculate the power value for power delivered into the first load, based on the calculated power delivered to the second load, the measured power signal and the reference power signal.

Alternatively, the processor may include a look-up table, and may be configured to retrieve from the look-up table the value of the power delivered to the second load, based on the impedance value of the second load, the measured voltage across the first load and the measured current through the first load.

The first and second current detectors may be implemented using respective first and second current detector resistances.

The first voltage detector may be implemented using a first current generator which is configured to generate an output current that is proportional to a voltage of the reference signal, and the second voltage detector may be implemented using a second current generator which is configured to generate an output current that is proportional to a voltage of the signal to be measured.

The first multiplier may be implemented using a first differential pair of transistors, and the second multiplier may be implemented using a second differential pair of transistors.

The first and second averaging units may be implemented using a filter including resistances and a capacitance.

According to a second aspect a method for measuring RF power delivered into a first load, of uncertain impedance, is provided. The method includes transmitting a known reference signal to a second load which has a known impedance. The method further includes, using a reference power meter, measuring a voltage across the second load; measuring a current through the second load; and multiplying the measured voltage across the second load by the measured current through the second load to generate a reference power signal that is proportional to the power delivered to the second load. The method further includes transmitting a signal to be measured to the first load and, using a measurement power meter, measuring a voltage across the first load; measuring a current through the first load; and multiplying the measured voltage across the first load by the measured current through the first load to generate a measured power signal that is proportional to the power delivered to the first load. The reference power meter and the measurement power meter are configured substantially identically, such that a constant of proportionality that links the reference power signal to the power delivered to the second load is equal to a constant of proportionality that links the measured power signal to the power delivered to the first load. The method further includes calculating, based on the voltage of the known reference signal and the impedance of the second load, a power value for power delivered to the second load, and generating, based on the calculated power delivered to the second load, the measured power signal and the reference power signal, a power value for power delivered into the first load.

BRIEF DESCRIPTION OF THE DRAWINGS

Embodiments of the disclosure will now be described, strictly by way of example only, with reference to the accompanying drawings, of which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
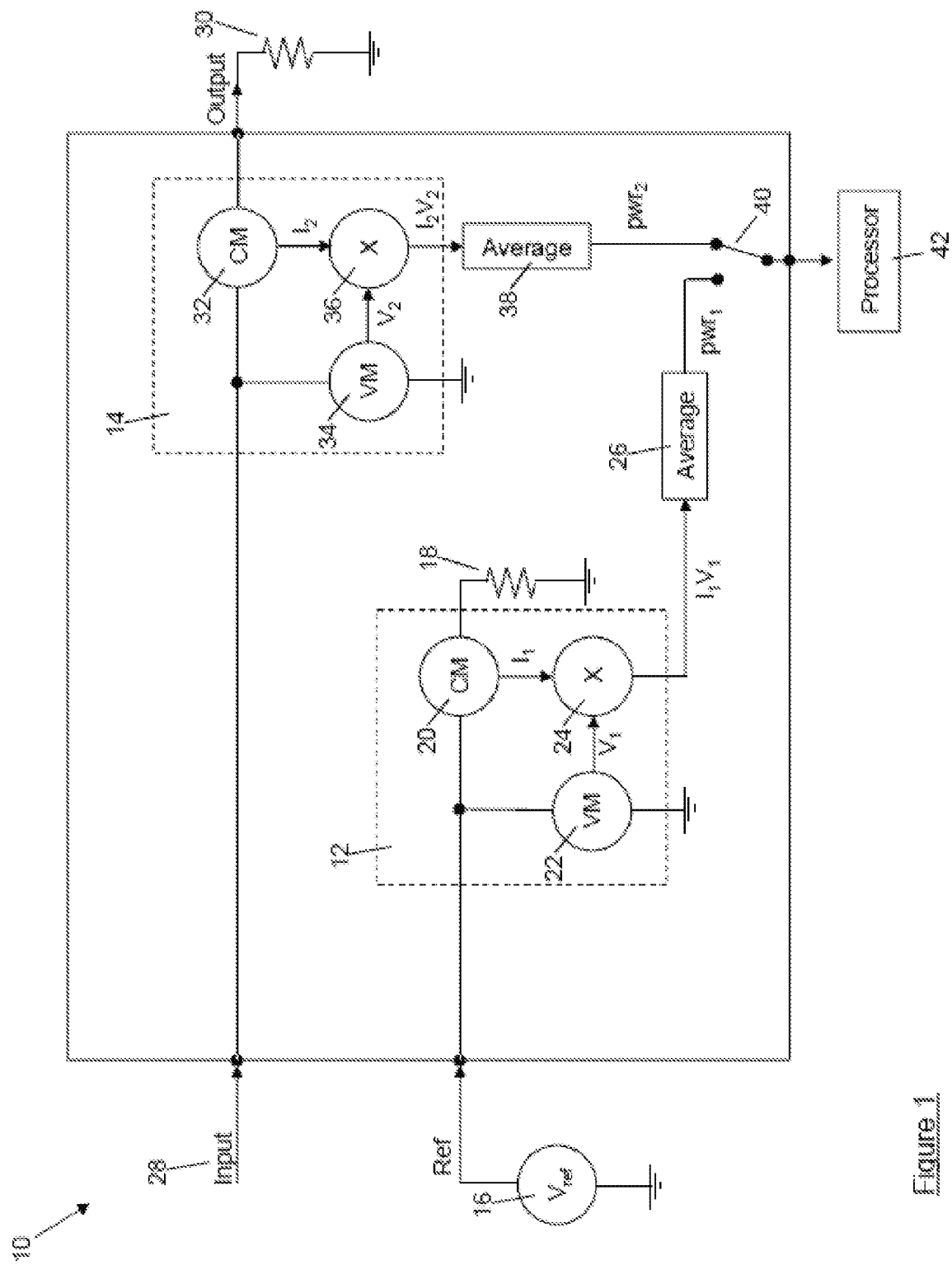
FIG. 1 is a schematic representation of an RF power detector.

FIG. 1 is a schematic representation of a power detector for measuring RF power that is provided to a load of uncertain impedance. The expression "uncertain impedance" as used herein means that the load has a nominal impedance value, but the actual impedance of the load may vary from the nominal value due to factors such as temperature, current bias or voltage, for example.

The power detector of the present disclosure exploits the fact that RF power delivered into a load is equal to the product of the RF voltage across the load and the current through the load, to facilitate load-independent measurement or estimation of RF power delivered into the load.

The power detector is shown generally at 10, and comprises a reference power meter 12 and a measurement power meter 14. The reference power meter 12 has an input which receives a known reference signal $V_{ref}$ having a known voltage from a reference signal generator 16, and an output which is connected to a load 18 of known impedance $z_c$. The reference signal may be a DC signal (i.e. having a frequency of 0 Hz), or may be an AC signal having any other frequency with any known waveform for which the RMS (root mean square) amplitude is known. The use of a DC reference signal is advantageous, particularly where the power detector 10 is implemented as an integrated circuit (IC, or chip) as a DC reference is always available on the integrated circuit, so no additional circuitry is required to provide the reference signal, which in turn helps to minimise the production cost of the IC. These advantages are of course equally applicable to discrete circuit implementations of the power detector 10. The impedance $z_c$ of the load 18 may take any suitable value, for example 50 ohms.

The reference power meter 12 includes a current detector 20, which is configured to measure current flowing through the load 18 and to output a signal $I_1$ representing the current through the load 18, and a voltage detector 22, which is configured to measure voltage across the load 18 and to output a signal $V_1$ representing the voltage across the load 18. Outputs of the current detector 20 and the voltage detector 22 are connected to inputs of a multiplier 24, which is configured to perform a vector multiplication to multiply the real-time current signal $I_1$ output by the current detector 20 and the real-time voltage signal $V_1$ output by the voltage detector 22, and to output a signal representing the result $(V_1 I_1)$ of that multiplication, which signal is proportional to the power delivered into the active part of the impedance of the load 18.

An output of the multiplier 24 is connected to an input of a first averaging unit 26, which is configured to generate an average of the multiplication result over time, using the formula:

$$Avr_1 = \frac{1}{T}\int_0^T V_1 I_1 * dt \qquad (1)$$

where T is real time, to filter out any oscillations arising, for example, from the presence of a carrier signal.

This averaging may take place over at least one period of the input signal. For example, for an input signal having a frequency of 2.4 GHz, the averaging could take place over a period of 1 nanosecond, which is just over two periods of the signal, as one period of a 2.4 GHz signal is approximately 0.416 nanoseconds.

The first averaging unit 26 outputs a signal representing this time-averaged multiplication result, which signal $pwr_1$ is proportional to the power delivered into the load 18:

$$pwr_1 = k * \frac{1}{2} * V_1 I_1 * \cos(\phi_1) \qquad (2)$$

where $\phi_1$ is the phase difference between voltage and current for the load 18.

For example, assume that the value of the voltage signal $V_1 = V_1 \cos \omega t$, and the value of the current signal $I_1 = I_1 \cos(\omega t + \phi)$. The angle $\phi$ is the phase difference between the voltage and the current. The result of the multiplication of the voltage signal $V_1$ and the current signal $I_1$ will be:

$$V_1 I_1 = V_1 I_1 \cos(\omega t + \phi)\cos(\omega t) = I_1 V_1 * \frac{1}{2}[\cos(\phi) + \cos(2*\omega t + \phi)] \qquad (3)$$

Averaging of the signal removes the component $I_1 V_1 * \frac{1}{2} \cos(2*\omega t + \phi)$, leaving an output signal of $I_1 V_1 * \frac{1}{2} \cos(\phi)$, which is proportional to the power delivered to the load 18, as indicated in the equation (2) above.

This can be re-written as $pwr_1 = k * Pz_c$, where $Pz_c$ is the power delivered to the load 18 and k is an implementation constant.

The measurement power meter 14 is substantially identical in structure and construction to the reference power meter 12. The measurement power meter 14 receives, at an input, an input signal $V_{in}$ from a signal source 28, and is connected, at an output, to a load 30 of uncertain impedance $z_u$.

The measurement power meter 14 includes a current detector 32, which is configured to measure current flowing through the load 30 and to output a signal $I_2$ representing the current through the load 30, and a voltage detector 34, which is configured to measure voltage across the load 30 and to output a signal $V_2$ representing the voltage across the load 30. Outputs of the current detector 32 and the voltage detector 34 are connected to inputs of a multiplier 36, which is configured to perform a vector multiplication to multiply the real-time current signal $I_2$ output by the current detector 32 and the real-time voltage signal $V_2$ output by the voltage detector 34, and to output a signal representing the result ($V_2 I_2$) of that multiplication, which signal is proportional to the power delivered into the active part of the impedance of the load 30.

An output of the multiplier 36 is connected to an input of a second averaging unit 38, which is configured to generate an average of the multiplication result over time, using the formula:

$$Avr_2 = \frac{1}{T}\int_0^T V_2 I_2 * dt \qquad (4)$$

where T is real time, to filter out any oscillations arising, for example, from the presence of a carrier signal. Again, this averaging may take place over at least one period of the input signal. For example, for an input signal having a frequency of 2.4 GHz, the averaging could take place over a period of 1 nanosecond, which is just over two periods of the signal, as one period of a 2.4 GHz signal is approximately 0.416 nanoseconds.

The second averaging unit 38 outputs a signal representing this time-averaged multiplication result, which signal $pwr_2$ is proportional to the power delivered into the load 30:

$$pwr_2 = k * \tfrac{1}{2} * V_2 I_2 * \cos(\phi_2) \qquad (5)$$

where $\phi_2$ is the phase difference between voltage and current for the load 18.

This can be re-written as $pwr_2 = k*Pz_u$, where $Pz_u$ is the power delivered to the load 30 and k is an implementation constant. Because the measurement power meter 14 is substantially identical in structure and construction to the reference power meter 12, the implementation constant k is the same for both the reference power meter 12 and the measurement power meter 14.

The signals output by the first and second averaging units 26, 38 are input to a multiplexer 40, which selectively transmits one of the signals to a processing unit 42. The processing unit 42 is operative to calculate the power delivered to the load 30, based on the voltage of the known reference signal $V_{ref}$ and the impedance $z_c$ of the load 18 of known impedance, the measured power signal $pwr_2$ and the reference power signal $pwr_1$, as will now be explained.

The RMS (root mean square) voltage of the reference signal $V_{ref}$ is known, and the impedance $z_c$ of the load 18 is also known. These values are used by the processing unit 42 to generate a power value for the power of the reference signal delivered to the load 18, using the relation:

$$Pz_c = \frac{V_{ref}^2}{z_c} \qquad (6)$$

It will be recalled that the measured power of the reference signal is:

$$pwr_1 = k*Pz_c \qquad (7)$$

and that the measured power of the signal to be measured is:

$$pwr_2 = k*Pz_u \qquad (8)$$

It will also be recalled that the implementation constant k is identical for the reference power meter 12 and the measurement power meter 14. From this it follows that:

$$Pz_u = Pz_c * \frac{pwr_2}{pwr_1} \qquad (9)$$

$Pz_c$ is known from equation (6) above, whilst $pwr_2$ and $pwr_1$ are the average measured power values output by the averaging units 28, 38, respectively. Thus, the processing unit 42 is able to generate an accurate measurement of the instantaneous power delivered to the load 30.

Initially the multiplexer 40 transmits the signal output by the first averaging unit 26 to the processing unit 42, which performs the calculations described above to calculate the power delivered to the load 18. The multiplexer 40 then switches, transmitting the signal output by the second averaging unit 38 to the processing unit 42. In this way, the power detector 10 first calibrates itself and then makes the required measurement of the power delivered to the load 30. If re-calibration is required, the multiplexer 40 can switch back, to connect the output of the first averaging unit 26 to the processor 40, which can then re-calculate the power delivered to the load 18, for subsequent use in measuring the power delivered to the load 30.

In the exemplary system described above, the processing unit 42 is operative to calculate the power delivered to the known load 18, and to use the results of this calculation to calculate or measure the power delivered to the load 30 of uncertain impedance. In an alternative implementation, the processing unit 42 may include a simple look-up table, which uses the impedance value $z_c$ of the load 18 of known impedance and the values of the signal $I_1$ representing the current through the load 18, and the signal $V_1$ representing the voltage across the load 18, or the value of the average $Avr_1$ of the product $V_1 I_1$ as indices to a corresponding value of the power delivered to the load 30 of uncertain impedance. Thus, instead of calculating the value of the power delivered to the load 30 of uncertain impedance, the processing unit 42 can simply look up this value. In this way, the design and operation of the processing unit 42 can be simplified and therefore reduced in cost.

Figure 2:
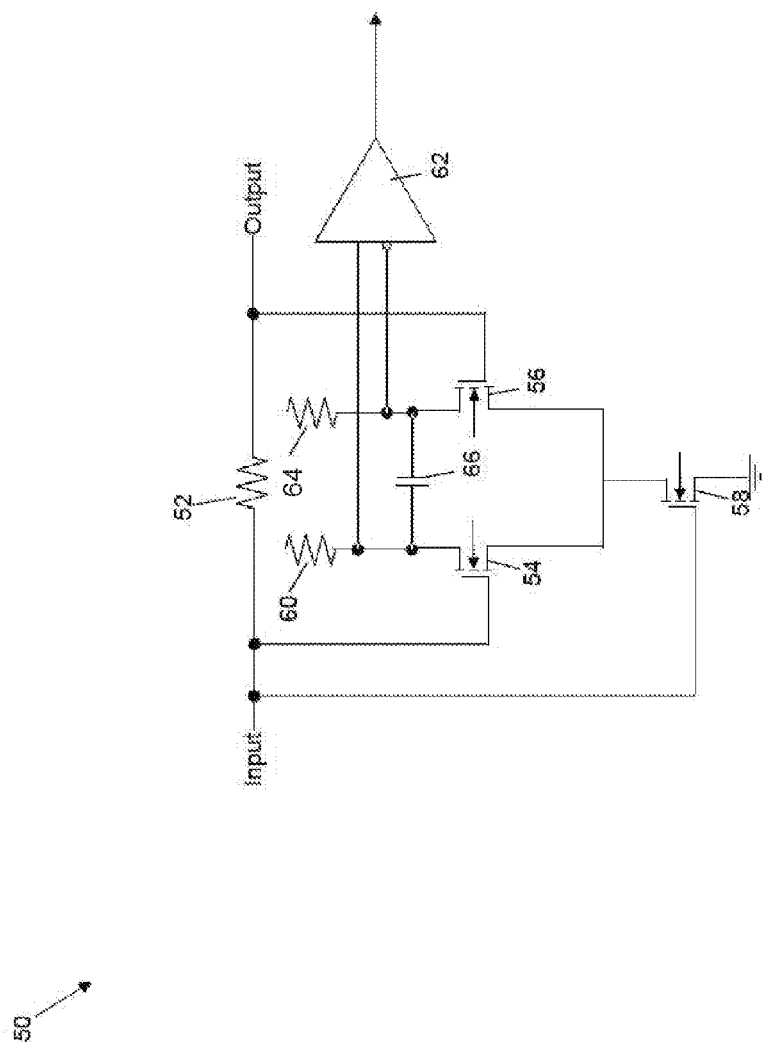
FIG. 2 is an exemplary circuit implementation of a power meter used in the power detector illustrated in FIG. 1.

FIG. 2 is a schematic representation of an exemplary circuit implementation 50 of the power meters 12, 14 used in the power detector 10 illustrated in FIG. 1, for a single-ended connection.

In the power meter circuit implementation 50, a current detector is implemented using a current detector resistance 52 connected in series between input and output terminals of the circuit 50. The resistance 52 may have a low resistance value, for example a resistance in the range from 0.1 to 2 ohms. The output signal of the current detector is a current that is proportional to the current through the resistance 52. As the resistance 52 is in series with a load (e.g., the load 18 or the load 30 of the power detector 10 of FIG. 1) of the circuit (not shown), the output signal of the current detector is a current that is proportional to the current through the load.

As shown in FIG. 2, an end of the current detector resistance 52 that is connected to the input terminal of the circuit 50 is connected to a gate terminal of a first transistor 54. An end of the current detector resistance 52 that is connected to the output terminal of the circuit 50 is connected to a gate terminal of a second transistor 56. The first transistor 54 and the second transistor 56 form a differential pair, and may be, for example, N-channel metal oxide semiconductor field effect transistors (MOSFETs).

A current generator is connected to the input terminal of the circuit 50, and is operative to generate a current that is proportional to the voltage at the input terminal of the circuit 50 (and therefore the voltage across the load of the circuit 50). Thus, where the circuit 50 is used to implement the reference power meter 12, the output current of the current generator is proportional to the voltage of the reference signal $V_{ref}$, whereas where the circuit 50 is used to implement the measurement power meter 14, the output current of the current generator is proportional to the voltage of the input signal to be measured.

In the circuit 50 illustrated in FIG. 2 the current generator is implemented using a third transistor 58, which may be, for example, a N-channel MOSFET. The current generator therefore acts as a voltage detector.

The output of the current generator, which in the exemplary implementation illustrated in FIG. 2 is the drain terminal of the third transistor 58, is connected to the source terminals of the first and second transistors 54, 56.

The first and second transistors 54, 56 in combination act as a multiplier, and are operative to multiply the output of the current generator (which, as indicated above, acts as a voltage detector and outputs a current that is proportional to the voltage across the load) and the output of the current detector. Differential output currents are therefore present at the drain terminals of the first and second transistors 54, 56.

A first current to voltage conversion resistor 60 is connected to a drain terminal of the first transistor 54, and is operative to convert the current output at the drain terminal of the first transistor 54 into a voltage. A first input terminal of a differential amplifier 62 is connected between the drain terminal of the first transistor 54 and the first current to voltage conversion resistor 60

A second current to voltage conversion resistor 64 is connected to a drain terminal of the second transistor 56, and is operative to convert the current output at the drain terminal of the second transistor 56 into a voltage. A second input terminal of the differential amplifier 62 is connected between the drain terminal of the second transistor 56 and the second current to voltage conversion resistor 64

A capacitor 66 is connected at one end to the drain terminal of the first transistor 54 and at the other end to the drain terminal of the second transistor 56, and is operative, in conjunction with the first and second current to voltage conversions resistors 60, 64, to average the signals at the drain terminals of the first and second transistors 54, 56.

The differential amplifier 62 converts the differential voltage signals at its inputs to a single ended output signal that is proportional to the voltage of the power being supplied to the output terminal of the circuit 50.

The circuit illustrated in FIG. 2 may be used to implement the reference power meter 12 or the measurement power meter 14, or both, of the power detector 10 shown in FIG. 1. The current detectors 20, 32 are implemented by the current detector resistance 52, whilst the voltage detectors 22, 34 are implemented by the current generator transistor 58. The multipliers 24, 36 are implemented by the differential pair of transistors 54, 56, and the averaging units 26, 38 are implemented by a filter made up of the capacitor 66 and the first and second current to voltage conversions resistors 60, 64.

The power detector 10 may find application in a wide variety of fields. For example, the power detector 10 may be used in the design and manufacture of an RF transmit chain, to tune an antenna where an antenna matching circuit is used between a power amplifier and the antenna. In this application, a signal of known power would be output by the power amplifier and the RF power delivered to the antenna would be measured using the power detector 10. The antenna would then be tuned, using the antenna matching circuit, to minimise the difference between the measured power and the power of the signal output by the power amplifier.

As a further example, the power detector 10 may be used in an RF transmitter to provide an accurate measurement of the power delivered into the antenna, with this measurement being used to adapt dynamically the signal output by the RF transmitter in order to meet regulatory requirements regarding the output power mask or envelope of the transmitted signal, to ensure that components such as a power amplifier of the transmitter are operating within safe limits, and to minimise current consumption (and therefore power consumption) in the transmitter.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. A power detector for measuring RF power delivered into a first load of uncertain impedance, the power detector comprising:
    a reference power meter for measuring the power of a known reference signal, wherein the reference power meter has an input which receives the known reference signal and an output connected to a second load which is of known impedance, and wherein the reference power meter comprises:
        a first voltage detector configured to measure a voltage across the second load;
        a first current detector configured to measure a current through the second load; and
        a first multiplier for multiplying the measured voltage across the second load by the measured current through the second load to generate a reference power signal that is proportional to the power delivered to the second load;
    a measurement power meter for measuring the power of a signal to be measured, wherein the measurement power meter has an input which receives the signal to be measured and an output connected to the first load, and wherein the measurement power meter comprises:
        a second voltage detector configured to measure a voltage across the first load;

a second current detector configured to measure a current through the first load; and a second multiplier for multiplying the measured voltage across the first load by the measured current through the first load to generate a measured power signal that is proportional to the power delivered to the first load;

wherein the reference power meter and the measurement power meter are configured substantially identically, such that a constant of proportionality that links the reference power signal to the power delivered to the second load is equal to a constant of proportionality that links the measured power signal to the power delivered to the first load;

and wherein the power detector further comprises a processor configured to calculate, based on a voltage of the known reference signal and the impedance of the second load, a power value for power delivered to the second load, and to generate, based on the calculated power delivered to the second load, the measured power signal and the reference power signal, a power value for power delivered into the first load.

2. A power detector according to claim 1, wherein the reference power meter further comprises a first averaging unit configured to generate an average of the reference power signal over time, and wherein the measurement power meter further comprises a second averaging unit configured to generate an average of the measured power signal over time.

3. A power detector according to claim 2, wherein the first averaging unit is configured to generate the average over at least one period of the reference power signal, and wherein the second averaging unit is configured to generate an average over at least one period of the measured power signal.

4. A power detector according to claim 1, wherein the first and second multipliers are configured to perform a vector multiplication.

5. A power detector according to claim 1 wherein the reference power signal is a DC signal.

6. A power detector according to claim 1 wherein the reference power signal is an AC signal having a root mean square amplitude of known value.

7. A power detector according to claim 1 further comprising a multiplexer configured selectively to transmit a signal output by the first power meter or a signal output by the second power meter to the processor.

8. A power detector according to claim 1 wherein the processor is configured to calculate the power value for power delivered into the first load, based on the calculated power delivered to the second load, the measured power signal and the reference power signal.

9. A power detector according to claim 1 wherein the processor comprises a look-up table, and is configured to retrieve from the look-up table the value of the power delivered to the second load, based on the impedance value of the second load, the measured voltage across the first load and the measured current through the first load.

10. A power detector according to claim 1, wherein the first and second current detectors are implemented using respective first and second current detector resistances.

11. A power detector according to claim 1, wherein the first voltage detector is implemented using a first current generator which is configured to generate an output current that is proportional to a voltage of the reference signal, and wherein the second voltage detector is implemented using a second current generator which is configured to generate an output current that is proportional to a voltage of the signal to be measured.

12. A power detector according to claim 1, wherein the first multiplier is implemented using a first differential pair of transistors, and wherein the second multiplier is implemented using a second differential pair of transistors.

13. A power detector according to claim 2 wherein the first and second averaging units are implemented using a filter comprising resistances and a capacitance.

14. A method for measuring RF power delivered into a first load, of uncertain impedance, the method comprising:
transmitting a known reference signal to a second load which has a known impedance;
using a reference power meter:
measuring a voltage across the second load;
measuring a current through the second load; and
multiplying the measured voltage across the second load by the measured current through the second load to generate a reference power signal that is proportional to the power delivered to the second load;
transmitting a signal to be measured to the first load;
using a measurement power meter:
measuring a voltage across the first load;
measuring a current through the first load; and
multiplying the measured voltage across the first load by the measured current through the first load to generate a measured power signal that is proportional to the power delivered to the first load;
wherein the reference power meter and the measurement power meter are configured substantially identically, such that a constant of proportionality that links the reference power signal to the power delivered to the second load is equal to a constant of proportionality that links the measured power signal to the power delivered to the first load;
and wherein the method further comprises calculating, based on the voltage of the known reference signal and the impedance of the second load, a power value for power delivered to the second load, and generating, based on the calculated power delivered to the second load, the measured power signal and the reference power signal, a power value for power delivered into the first load.

* * * * *